Figure 1:
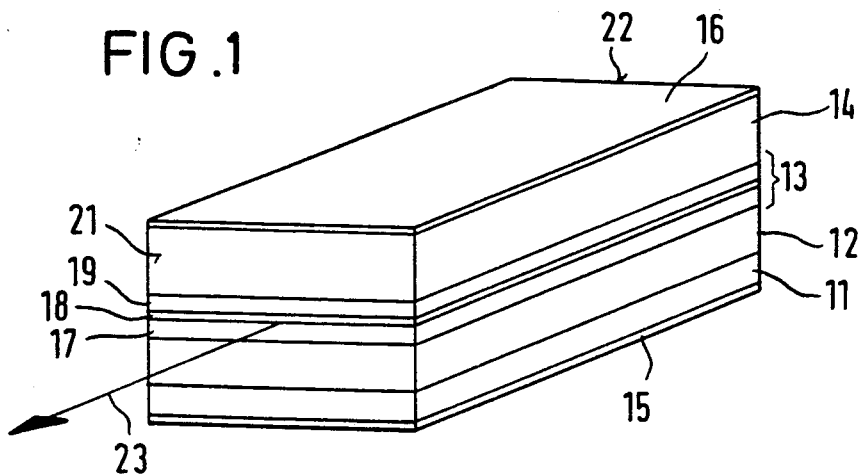

United States Patent [19]

Lobentanzer et al.

[11] Patent Number: 5,057,881

[45] Date of Patent: Oct. 15, 1991

[54] LIGHT EMITTING COMPOSITIONAL SEMICONDUCTOR DEVICE

[75] Inventors: Hans Lobentanzer, Munich; Wolfgang Stolz, Ammerbusch; Klaus Ploog, Stuttgart, all of Fed. Rep. of Germany; Julien Nagle, Hackensack, N.J.

[73] Assignee: Max-Planck Gesellschaft zur Forderung der Wissenschaften e.V., Gottingen, Fed. Rep. of Germany

[21] Appl. No.: 444,194

[22] Filed: Nov. 30, 1989

[30] Foreign Application Priority Data

Dec. 2, 1988 [DE] Fed. Rep. of Germany ....... 3840717

[51] Int. Cl.$^5$ .................... H01L 33/00; H01L 27/12; H01L 29/161
[52] U.S. Cl. ......................... 357/17; 357/4; 357/16; 357/45; 357/47; 357/50
[58] Field of Search ................ 357/17, 4, 16; 372/45, 372/47, 50

[56] References Cited

U.S. PATENT DOCUMENTS

| | | | |
|---|---|---|---|
| 4,630,083 | 12/1986 | Yamakushi | 357/17 |
| 4,787,089 | 11/1988 | Hayakawa et al. | 357/17 |
| 4,841,531 | 6/1989 | Kondon et al. | 357/17 |
| 4,841,533 | 6/1989 | Hayakawa et al. | 357/17 |
| 4,905,060 | 2/1990 | Chinone et al. | 357/17 |
| 4,933,728 | 6/1990 | Fukuzawa et al. | 357/17 |

*Primary Examiner*—Andrew J. James
*Assistant Examiner*—Ngan Van Ngo
*Attorney, Agent, or Firm*—Townsend and Townsend

[57] ABSTRACT

A multiple quantum well light emitting compositional semiconductor device such as a laser diode or a light emitting diode has an active region comprising an alternating sequence of layers of well layer material and of barrier layer material. The thickness of the barrier layer and of the adjacent well layers is chosen such that for one type of charge carrier a relatively high probability exists for such charge carriers to be present in the barrier region whereas the other type of charge carriers are localized in the potential wells. In this way it is possible to reduce the probability of non-radiative Auger recombination processes occurring thus reducing the threshold current and increasing the quantum efficiency of the device. This is particularly important since material systems with a small bandgap which lase at long wavelengths suitable for optical fibre transmission normally suffer performance penalties due to non-radiative Auger recombination and these penalties can be substantially reduced by tailoring the layer thicknesses to achieve the described probability distributions.

13 Claims, 2 Drawing Sheets

LIGHT EMITTING COMPOSITIONAL SEMICONDUCTOR DEVICE

The present invention relates to a light emitting semiconductor device. Such devices are known, for example in the form of semiconductor lasers and light emitting diodes.

Semiconductor lasers are used in many fields. One particular field of interest is optical communication systems where information signals are transmitted along optical fibres, often over very large distances. Optical fibres attenuate the signals with increasing length and it is important to use optical signals at wavelengths where attenuation and dispersion are at a minimum. For modern optical fibres the ideal wavelengths lie typically in the range from about 1.2 to 1.7 µm, and indeed proposals are made for longer wavelength fibres, currently with wavelengths up to 4 µm.

At the wavelengths of interest, i.e. longer than about 1.2 µm, the choice of light emitting semiconductor devices is limited to materials where non-radiative Auger recombination effects disadvantageously affect the device properties. Thus GaAs/AlGaAs lasers where non-radiative Auger recombination effects do not occur, cannot be used at these wavelengths.

In semiconductor devices radiative transitions occur when an electron in the conduction band combines with a hole in the valence band.

In semiconductor devices operating at longer wavelengths use is made of semiconductors where the valence band is a composite band having a heavy hole band, a light hole band and a split off band. Various so-called Auger recombination processes have been identified all of which involve at least three particles. These processes result in the recombination of an electron from the conduction band with a heavy hole in the valence band but without the generation of a photon. Instead other simultaneous transitions take place for example, the energy lost by the electron is transferred to another electron which moves to a higher energetic position in the conduction band, or to a hole which moves from the light hole band to the heavy hole band. Since these processes are non-radiative they constitute losses.

The effect of these losses due to non-radiative Auger transitions is to increase the threshold current and to reduce the quantum efficiency of the semiconductor device. Reduced quantum efficiency is also disadvantageous with light emitting diodes. In order to achieve a sufficient signal strength with a semiconductor laser or LED where non-radiative Auger recombination processes occur it is necessary to operate the device at higher current densities and this is very problematic since it leads to increased heat dissipation and deterioration of the semiconductor structure, i.e. to shortened life and premature failure.

Having regard to these problems the object underlying the present invention is to provide semiconductor lasers and diodes in materials where non-radiative Auger recombination processes are normally encountered, but to structure the devices in such a way that the losses due to these effects are substantially reduced.

Starting from the known semiconductor lasers or light emitting diodes having active regions containing multiple quantum wells, for example as described in the Chapter entitled "Physics of Quantum Well Lasers" by N.K. Dutta in the book Heterojunction Band Discontinuities: Physics and Device Applications published by Elsevier Science Publishers BV 1987 or as described in the paper "Properties of 2-D Quantum Well Lasers", J. Nagle, S. Hersee, M. Razeghi, M. Krakowski, B. Decremoux and C. Weissbuch in the Journal "Surface Science" 174 (1986), pages 155 to 162 there is provided, in accordance with the present invention, a light emitting compositional semiconductor device having an active region comprising an alternating sequence of layers of well layer material of a first composition having a first bandgap and of barrier layer material of a second composition having a second bandgap larger than said first bandgap, with the layer thicknesses being chosen such that quantum confinement of charge carriers occurs, and with the well layer material forming quantum wells and the barrier layer material forming a barrier between each adjacent pair of quantum wells, there being at least two layers of well layer material with at least one barrier layer disposed between them, thus forming two quantum wells with one barrier between them, characterised in that the thickness of the or each barrier layer and of the adjacent well layers is chosen such that for one type of charge carrier a relatively high probability exists for such charge carriers to be present in the barrier region whereas the other charge carriers are localised in the potential wells.

The idea underlying the invention is based on the realisation that non-radiative Auger recombination processes are more likely when the electrons are localised close to the holes in real space due to the quantum well structure but that the likelihood of such non-radiative processes can be reduced if the probability of the electrons being present in the barrier layer can be increased, where the electrons are further removed from the holes.

In accordance with the invention the overlap between the electron and hole wave functions, calculated in accordance with the equation $$\text{overlap} = \int_{\text{active layer}} \psi_e^* \psi_h d\tau$$

is reduced by at least 10% and preferably by 16% or more in comparison to a configuration in which the electrons and holes are fully localised in the respective quantum wells (i.e., the probability of the electrons and holes being localized in their respective quantum wells is 1). Here $\psi_e$ is the electron wave function and $\psi_h$ is the hole wave function.

A first preferred embodiment of the light emitting device of the invention is characterised in that said well layer material comprises $Ga_xIn_{1-x}As$ and said barrier layer material comprises $Al_yIn_{1-y}As$; and in that the or each said barrier layer a thickness in the range 1.5 nm to 12 nm and said well layers have a thickness smaller than about 6 nm wherein this latter thickness can also correspond to the thickness of a monoatomic layer. In a preferred embodiment 0.6 nm ≦ thickness of each well layer ≦ 3 nm and 3 nm ≦ thickness of each barrier layer ≦ 12 nm. In practise the best results have hitherto been obtained with a well layer thickness of 1 nm and barrier layer thickness of 9 nm.

These dimensions provide a sufficiently thin barrier layer to realistically increase the probability of electrons being present therein, but do not make the barrier layers so thin that they become transparent to the electrons thus reducing the desired quantum well confinement. Small potential wells lead to a larger displacement of the quantised energy levels for electrons in comparison to heavy holes, and thus to a more pronounced penetration of the electron wave function into the barrier. With barrier widths in the medium range this leads to a substantial reduction of the overlap between electron and hole wave functions. For thin barriers the hole wave function also penetrates into the barrier whereas for barriers that are too thick the electrons and holes are again localised only in the potential well.

In a light emitting device of the above kind x is preferably chosen to be 0.47 and y is chosen to be 0.48 which results in the semiconductor material in the various layers being lattice matched to InP substrates. The devices themselves are, in accordance with the invention, preferably grown by epitaxial growth techniques such as molecular beam epitaxy and metal-organic chemical vapour deposition.

An alternative embodiment is based on the gallium indium arsenide phosphide system and is characterised in that said well layer material comprises $Ga_xIn_{1-x}As_yP_{1-y}$ and said barrier layer material comprises InP; and in that the or each said barrier layer has a thickness in the range between 1.5 nm and 12 nm and said active layers have a thickness smaller than about 4.5 nm. In this embodiment the dimensions of the layers are preferably the same as for the embodiment based on the gallium indium arsenide/aluminium indium arsenide system.

Moreover, with this embodiment $y = 2.2 x$ and x is in the range 0 to 1/2.2 which again results in lattice matching.

The invention is not however restricted to lattice matched systems but can also be used with strained layer systems with different well and barrier thicknesses.

On applying the concept of the invention to the GaInAs/AlInAs material system it has proved possible to reduce the Auger recombination coefficient from the values of about $4 \times 10^{-29} cm^6/sec$ for a standard quantum well structure to below $3.5 \times 10^{-29} cm^6/sec$ and indeed experiments have produced values of below $3 \times 10^{-29} cm^6/sec$ for the same emission wavelength. This reduction has a substantial benefit with regard to lower threshold currents and higher quantum efficiencies.

The light emitting device can, as previously mentioned, either be constructed as a light emitting diode or can be provided with reflecting end faces to produce laser action.

Figure 2A:
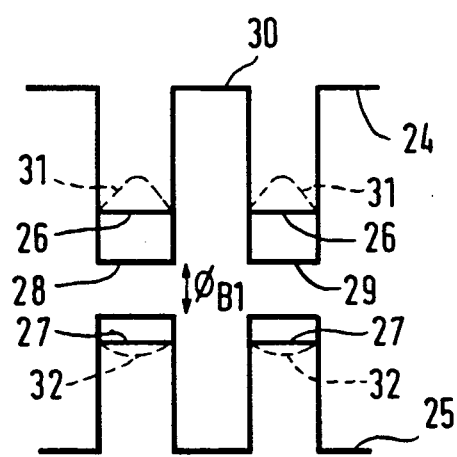
Figure 2B:
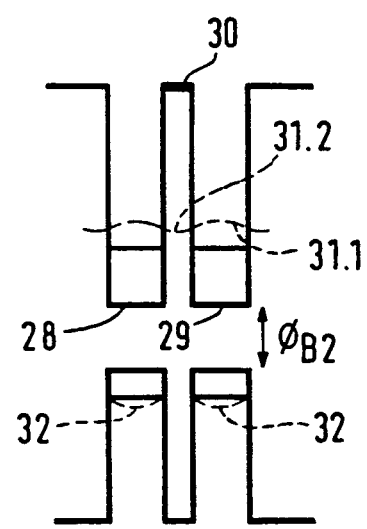
Figure 2C:
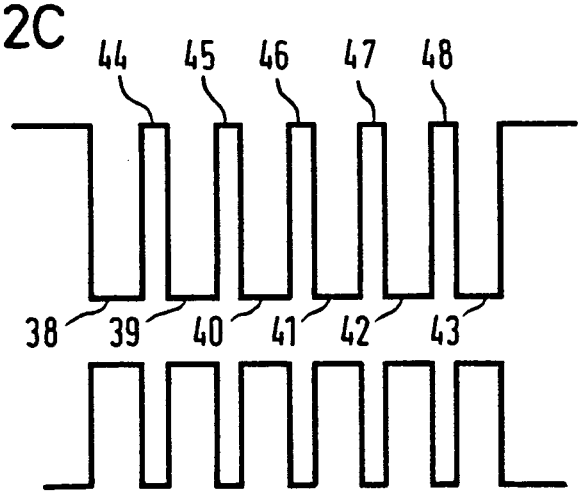
Figure 3:
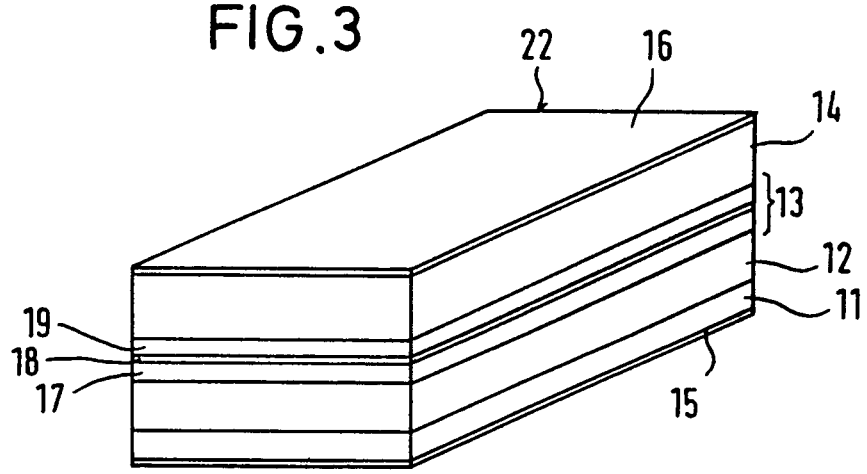
Figures 4A, 4B, 4C:
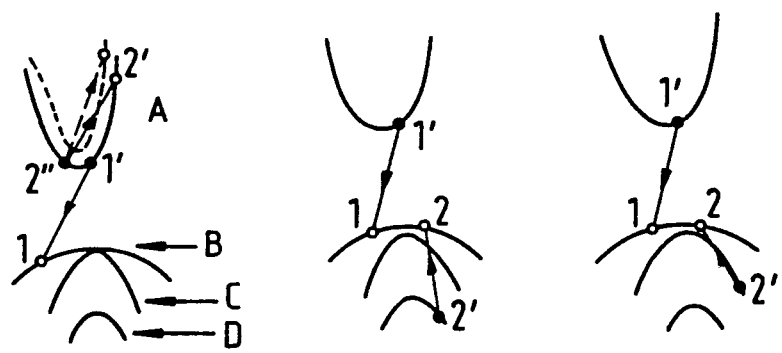

Embodiments of the invention will now be described, by way of example only and with reference to the accompanying drawings:

FIG. 1 is a schematic diagram of a double quantum well laser in accordance with the invention based on the GaInAs/AlInAs system, FIG. 2A is a band scheme for the active region of a double quantum well laser in accordance with the prior art, i.e. not dimensioned in accordance with the present invention and FIG. 2B is a band diagram for the active region of the semiconductor laser of FIG. 1, i.e. of a double quantum well semiconductor laser dimensioned in accordance with the present invention, FIG. 2C is a similar diagram for a multiple quantum well laser having six quantum wells and five barrier layers in the active region, FIG. 3 is a schematic representation of a semiconductor laser in accordance with the present invention based on the InGaAsP/InP system, FIG. 4A, B and C schematically illustrates three different band to band Auger recombination processes.

Referring first of all to FIG. 1 of the drawings there can be seen a schematic view of a compositional semiconductor laser based on the gallium indium arsenide/aluminium indium arsenide system. The laser comprises:

an n-type indium phosphide substrate 11, a layer of for example n-type indium phosphide 12 grown thereon, the layer 12 being typically 1 μm thick, an active region 13 defining a double quantum well structure, a further layer of indium phosphide 14, this time of p-type conductivity, and again of about 1 μm thickness, and first and second contacts 15 and 16 to the substrate and upper indium phosphide layer respectively.

The active region 13 comprises first and second well layers 17 and 19 of $Ga_xIn_{1-x}As$ where x is typically 0.47, with a barrier layer 18 of $Al_yIn_{1-y}As$ sandwiched between them, with y having a typical value of 0.48. The layers 17 and 19 have a thickness of 1 nm and the layer 18 a thickness of 9 nm.

The entire structure is grown by epitaxial growth techniques such as molecular beam epitaxy, apart that is from the contacts 15 and 16. The end faces 21 and 22 of the semiconductor laser device are cleaved making them reflecting. In operation energy is introduced by applying a suitable voltage across the contacts 15 and 16 and, above the current threshold, laser light having a peak wavelength of about 1.5 μm is emitted in the direction of the arrow 23 due to the stimulated emission of radiation. A similar structure would be obtained for a light emitting diode, here however there would be no need to have special reflecting surfaces 21 and 22.

The basic layer sequence of the double quantum well semiconductor laser of FIG. 1 is known per se in connection with gallium arsenide/aluminium gallium arsenide double quantum well lasers and FIG. 2a shows a typical band diagram for the active region of such a laser.

The conduction band is designated with the reference numeral 24 and the valence band with the reference numeral 25.

26 illustrates a quantised energy level for electrons in the conduction band and 27 designates a quantised energy level for holes in the valence band. These quantised energy levels are disposed in the two quantum wells 28 and 29 of the double quantum well structure. Between these two quantum wells 28, 29 there is a barrier 30 formed by the barrier layer 18. The bandgap is illustrated by $\phi_{B1}$.

The dotted lines 31 show the normalised probability distribution for the location of electrons in space in the potential wells 28 and 29. The dotted lines 32 show the same distribution for holes in the valence band, the distribution 32 is however somewhat flatter due to the different mobilities of the holes relative to the electrons.

FIG. 2B shows the same band diagram for the semiconductor laser of the invention and the same double quantum well structure is readily apparent. The special choice of the layer thicknesses for the regions 17, 18 and 19 has however resulted in a modified distribution 31.1 for the electrons and will be noted from the portion 31.2 of this distribution that there is a finite probability of some of these electrons being found in the barrier 30.

The distribution of holes in the valence band is however largely unchanged from that shown in FIG. 2A. Hence these distributions have been designated by the same reference numeral 32. The band diagram of FIG. 2B relates to a material with a higher relative bandgap $\phi_{B2}$ than the bandgap $\phi_{B1}$ shown in FIG. 2A and the invention is directed to such materials in particular since here the wavelength of the laser action is longer. As mentioned earlier this is desired for low loss optical transmission along optical fibres but can only be achieved in practice with material systems such as the GaInAsP/InP material system of the semiconductor laser of FIG. 1. With this material losses due to non-radiative Auger recombination pose a problem. However, with the special dimensioning of the layers of the active region of the invention the likelihood of such non-radiative Auger transitions can be substantially reduced for the reasons explained above, i.e. due to the fact that the spatial separation of the electrons present in the barrier region from the holes localised in the valence band reduces the probability of such non-radiative transitions.

Although the probability of radiative transitions is also somewhat reduced the reduction in the probability of radiative transitions is substantially less than the reduction in the probability of non-radiative Auger transitions, since the former follows a linear law whereas the latter follows a second power law.

FIG. 2C shows that the active region does not have to be restricted to two quantum wells indeed any number of quantum wells is possible and FIG. 2C shows an example with six quantum wells 38, 39, 40, 41, 42 and 43 which alternate with barriers 44, 45, 46, 47 and 48. Each pair of quantum wells, for example 38 and 39 and the barrier 44 between them can be thought of as being the equivalent of the quantum wells 28, 29 and the barrier layer 30 of FIG. 2B. Generally speaking there will be n−1 barrier layers with n quantum wells.

FIG. 3 shows a further semiconductor laser structure which from the point of view of its layer sequences is identical to that of FIG. 1, which is why the individual layers have been designated with the same reference numerals. The semiconductor device of FIG. 3 is however here based on the gallium indium arsenide phosphide/indium phosphide material system. More specifically the layer 11 is again an indium phosphide substrate of n-type conductivity. Layer 12 is a further layer of n-type indium phosphide grown onto the substrate and is doped to give it n-type conductivity, it may also be undoped. In either case the layer 12 would typically be 1 μm thick. In the active region the two layers 17 and 19 both comprise a $Ga_xIn_{1-x}As_yP_{1-y}$ material where y=2.2x. The layers 17 and 19 have thickness of smaller than 4 nm. The barrier layer 18 in this embodiment comprises indium phosphide, also with a barrier layer thickness of 4 nm. The layer 14 comprises p-type indium phosphide and once again the device is provided with metallic contacts 15 and 16 and cleaved reflecting faces 21 and 22.

The band structure is not shown here since it is substantially the same as the band structure shown in FIG. 2a, although there is a difference in the bandgap due to the different material compositions.

Finally, FIG. 4 explains diagrammatically three different non-radiative Auger recombination mechanisms which can occur in a compositional semiconductor device such as is disclosed in FIGS. 1 and 3.

In FIG. 4 the bandstructure of a typical semiconductor is shown. The valence band comprises of a heavy hole band, a light hole band and a split off band. In the left hand sketch an electron 1' recombines with a hole 1 but the energy liberated does not produce a photon but instead exites a further electron 2 to an exited state 2', it may also push the electron into a higher subband as shown by the broken line. In the centre diagram an electron 1' recombines non-radiatively with a hole 1 and at the same time a hole 2' moves to a more energetic hole state 2' in the split off band. In the right hand sketch the electron 1' again recombines with a hole 1 and the energy liberated is transferred to a hole 2 which moves to a higher energy position 2' in the light hole band.

We claim:

1. A light emitting compositional semiconductor device having an operating wavelength greater than 1.2 μm, the device being grown by epitaxy and having an active region comprising an alternating sequence of layers of material of a first composition having a first bandgap and of material of a second composition having a second bandgap larger than said first bandgap, with the thickness of said layers of first and second composition material being chosen such that quantum confinement of charge carriers occurs, with the first composition material forming quantum wells and the second composition material forming a barrier between each adjacent pair of quantum wells, there being at least two layers of first composition material with at least layer of second composition material disposed between said at least two layers of first composition material, thus forming two quantum wells with one barrier between said quantum wells, wherein the thickness of said at least one layer of second composition material and of the adjacent layers of first composition material is chosen such that for a first type of charge carrier a relatively high probability exists for such charge carriers to be present in the barrier region whereas charge carriers of a second type are localized in the potential wells, wherein charge carriers of said first type comprise electrons distributed in accordance with an electron wave function and charge carriers of said second type comprise holes distributed in accordance with a hole wave function, wherein said electron and hole wave functions have an overlap.

2. A light emitting device in accordance with claim 1, wherein the overlap between the electron and hole wave functions is reduced by at least 10% and preferably by 16% or more relative to a state in which a probability of the electrons and holes being localized in their respective quantum wells is 1.

3. A light emitting compositional semiconductor device having an operation wavelength greater than 1.2 μm, the device being grown by epitaxy and having an active region comprising an alternating sequence of layers of material of a first composition having a first bandgap and of material of a second composition having a second bandgap larger than said first bandgap, with the thicknesses of said layers of first and second composition material being chosen such that quantum confinement of charge carriers occurs, with the first composition material forming quantum wells and the second composition material forming a barrier between each adjacent pair of quantum wells, there being at least two layers of first composition with at least one layer of second composition material disposed between said at least two layers of first compositon material, thus forming two quantum wells with one barrier between said quantum wells, wherein the thickness of said at least one layer of second composition material and of the adjacent layers of first composition material is chosen such that for a first type of charge carrier a relatively high probability exists for such charge carrier to be present in the barrier region whereas charge carriers of a second type are localized in the potential wells, and wherein said first composition material comprises $Ga_xIn_{1-x}As$ and said second composition material comprises $Al_yIn_{1-y}As$; and wherein said at least one layer of second composition material has a thickness in the range 1.5 to 12 nm and said first composition material layers each have a thickness smaller than about 6 nm, wherein this latter thickness of said first composition material can also correspond to the thickness of a monoatomic layer.

4. A light emitting device in accordance with claim 3, wherein the thickness of each layer of first composition material lies in the range of from 0.6 nm to 3 nm and the thickness of each layer of second composition material lies in the range of from 3 nm to 12 nm.

5. A light emitting device in accordance with claim 3, wherein the thickness of each layer of first composition material amounts to substantially 1 nm and the thickness of each layer of second composition material amounts to substantially 9 nm.

6. A light emitting device in accordance with claim 3, wherein $x=0.47$ and $y=0.48$.

7. A light emitting compositional semiconductor device having an operation wavelength greater than 1.2 $\mu$m, the device being grown by epitaxy and having an active region comprising an alternating sequence of layers of material of a first composition having a first bandgap and of material of a second composiiton having a second bandgap larger than said first bandgap, with the thicknesses of said layers of first and second composition material being chosen such that quantum confinement of charge carriers occurs, with the first composition material forming quantum wells and the second composition material forming a barrier between each adjacent pair of quantum wells, there being at least two layers of first composition with at least one layer of second composition material disposed between said at least two layers of first composition material, thus forming two quantum wells with one barrier between said quantum wells, wherein the thickness of said at least one layer of second composition material and of the adjacent layers of first composition material is chosen such that for a first type of charge carrier a relatively high probability exists for such charge carrier to be present in the barrier region whereas charge carriers of a second type are localized in the potential wells wherein said first composition material comprises $Ga_xIn_{1-x}P_{1-y}$ and said second composition material comprises InP; and wherein the said at least one layer of second composition material has a thickness in the range 1.5 nm to 12 nm and said layer of first composition material each have a thickness smaller than about 4.5 nm.

8. A light emitting device in accordance with claim 7, wherein $y=2.2x$ and x lies in the range from 0 to 1/2.2.

9. A light emitting device in accordance with claim 2, wherein the device is a strained layer system with different well and barrier thicknesses.

10. A light emitting device in accordance with claim 3, wherein said device operation at 1.24 $\mu$m at 10 K° has a non-radiative Auger recombination coefficient which lies below $3.5 \times 10^{-29}$ cm$^6$/sec.

11. A light emitting device in accordance with claim 1, wherein the device is constructed as a light emitting diode.

12. A light emitting device in accordance with claim 1 wherein the device has reflecting end faces to produce laser action and is configured as a semiconductor laser.

13. A light emitting device in accordance with claim 10 wherein said non-radiative Auger recombination coefficient lies below $3 \times 10^{-29}$ cm$^6$/sec.

* * * * *